United States Patent
Khan et al.

(10) Patent No.: US 10,511,289 B2
(45) Date of Patent: Dec. 17, 2019

(54) TIME SYNCHRONIZED NETWORKS OF WIRELESS NODES AND THE WIRELESS NODES

(71) Applicant: THE REGENTS OF THE UNIVERSITY OF CALIFORNIA, Oakland, CA (US)

(72) Inventors: Osama Khan, Berkeley, CA (US); Kristofer Pister, Orinda, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 16/079,917

(22) PCT Filed: Feb. 27, 2017

(86) PCT No.: PCT/US2017/019721
§ 371 (c)(1),
(2) Date: Aug. 24, 2018

(87) PCT Pub. No.: WO2017/147591
PCT Pub. Date: Aug. 31, 2017

(65) Prior Publication Data
US 2019/0058459 A1 Feb. 21, 2019

Related U.S. Application Data

(60) Provisional application No. 62/300,646, filed on Feb. 26, 2016.

(51) Int. Cl.
*H04W 56/00* (2009.01)
*H04L 7/00* (2006.01)
(Continued)

(52) U.S. Cl.
CPC ............... *H03J 7/186* (2013.01); *H03J 1/00* (2013.01); *H03J 1/0025* (2013.01); *H03J 7/00* (2013.01);
(Continued)

(58) Field of Classification Search
None
See application file for complete search history.

(56) References Cited

U.S. PATENT DOCUMENTS 6,957,053 B1   10/2005   Moers
8,149,880 B1 *  4/2012   Cho ..................... H04J 3/0664
                                                    370/256
(Continued)

FOREIGN PATENT DOCUMENTS

EP   2150062 A1    2/2010
WO   2009/019639 A2   2/2009
WO   2014177191 A1   11/2014

OTHER PUBLICATIONS

International Search Report dated May 30, 2017 in PCT/US2017/019721.
(Continued)

*Primary Examiner* — Lana N Le
(74) *Attorney, Agent, or Firm* — Venable LLP; Henry J. Daley

(57) ABSTRACT

A wireless network includes a tunable RF transmitter in wireless communication with a master node to transmit at a first slave frequency; a tunable RF receiver in wireless communication with the master node to receive at a second slave frequency; and an RF oscillator to communicate with the RF receiver and the RF transmitter an RF oscillator frequency to determine and tune the first and second slave frequencies. The RF oscillator is configured to receive calibration information including time information or frequency information, or both, from a reference node. The RF
(Continued)

oscillator frequency of the RF oscillator is tuned based on the calibration information from the reference node to enable communication between the slave node and the master node at the tuned RF oscillator frequency.

19 Claims, 10 Drawing Sheets

(51) Int. Cl.
    *H03J 7/18*     (2006.01)
    *H03J 1/00*     (2006.01)
    *H03J 7/00*     (2006.01)

(52) U.S. Cl.
    CPC ............ *H04L 7/00* (2013.01); *H04L 7/0016* (2013.01); *H04W 56/0035* (2013.01)

(56) References Cited

U.S. PATENT DOCUMENTS

| | | | | |
|---|---|---|---|---|
| 2002/0114354 A1* | 8/2002 | Sinha | ............... | H04J 3/0658 370/503 |
| 2004/0062278 A1* | 4/2004 | Hadzic | ............... | H03L 7/085 370/503 |
| 2007/0086487 A1* | 4/2007 | Yasuda | ............... | H04J 3/0664 370/503 |
| 2008/0316996 A1* | 12/2008 | Hatala | ............... | H04J 3/0697 370/350 |
| 2010/0111113 A1* | 5/2010 | Wong | ............... | H04J 3/0664 370/503 |
| 2011/0185216 A1* | 7/2011 | Zhao | ............... | G06F 1/14 713/401 |
| 2013/0034197 A1* | 2/2013 | Aweya | ............... | H04J 3/0664 375/362 |
| 2013/0275636 A1 | 10/2013 | Decesaris et al. | | |
| 2014/0056286 A1 | 2/2014 | Nagata | | |
| 2015/0071309 A1* | 3/2015 | Aweya | ............... | H04J 3/0682 370/503 |

OTHER PUBLICATIONS

Written Opinion completed May 18, 2017 in PCT/US2017/019721.

Chang et al., "Adaptive synchronization in multi-hop TSCH networks," Computer Networks, vol. 76, pp. 165-176, Jan. 2015.

Griffith et al., "A 190nW 33kHz RC oscillator with ±0.21% temperature stability and 4ppm long-term stability," in olid-State Circuits Conference Digest of Technical Papers (ISSCC), 2014 IEEE International, Feb. 2014, pp. 300-301.

Hsiao, "A 32.4 ppm/° C. 3.2-1.6V self-chopped relaxation oscillator with adaptive supply generation," in in VLSI Circuits (VLSIC), 2012 Symposium on, Jun. 2012, pp. 14-15.

Jeong et al., "A 5.8 nW CMOS Wake-Up Timer for Ultra-Low-Power Wireless Applications," Solid-State Circuits, IEEE Journal of, vol. 50, No. 8, Aug. 2015, pp. 1754-1763.

Paidimarri et al., "A 120nW 18.5kHz RC oscillator with comparator offset cancellation for ±0.25% temperature stability," in Solid-State Circuits Conference Digest of Technical Papers (ISSCC), 2013 IEEE International, Feb. 2013, pp. 184-185.

Pister et al., "TSMP: Time synchronized mesh protocol," in IASTED Distributed Sensor Networks, 2008, pp. 391-398.

Schmid et al., "On the Interaction of Clocks, Power, and Synchronization in Duty-Cycled Embedded Sensor Nodes," ACM Transactions on Sensor Networks (TOSN), Sep. 2010, vol. 7, No. 3.

* cited by examiner

TIME SYNCHRONIZED NETWORKS OF WIRELESS NODES AND THE WIRELESS NODES

CROSS-REFERENCE TO RELATED APPLICATIONS

This application is a National Stage Application under 35 U.S.C. § 371 PCT/US2017/019721, filed Feb. 27, 2017, which claims priority benefit from U.S. provisional patent application No. 62/300,646, filed on Feb. 26, 2016, the entire content of which is incorporated herein by reference. The present application is related to U.S. provisional patent application No. 62/333,506 entitled "Crystal Free Radio," filed on May 9, 2016, the entire content of which is also incorporated herein by reference. All references cited anywhere in this specification, including the Background and Detailed Description sections, are incorporated by reference as if each had been individually incorporated.

STATEMENT OF GOVERNMENT INTEREST

The present invention was made with government support under Grant Number HR0011-14-2-0001 awarded by the U.S. Defense Advanced Research Projects Agency (DARPA). The U.S. government has certain rights in the invention.

BACKGROUND

1. Field

The present application is directed to networks in general and in particular to time synchronized networks of wireless nodes and to wireless nodes in a network.

2. Background

Almost every standard compliant wireless system as of today uses quartz technology for precise timing and frequency reference. The quartz crystal (Xtal) is a bulky off-chip component that puts a size limitation towards miniaturization and adds to the Bill of Material (BOM) cost of a sensor node. Accordingly, improved systems and methods are required for precise timing and frequency references in wireless systems.

SUMMARY OF THE DISCLOSURE

An aspect of the present disclosure is to provide a wireless network. The wireless network includes a master node comprising a master radio frequency (RF) transmitter configured to transmit at a master frequency, the master frequency being generated by the master node using a master clock; and a slave node. The slave node includes a tunable RF receiver configured to be in wireless communication with the master node and to receive at a slave frequency; and an RF oscillator configured to communicate with the tunable RF receiver, the RF oscillator being configured to communicate an RF oscillator frequency to the tunable RF receiver to determine and tune the slave frequency. The slave node also includes a signal processor configured to communicate with the tunable RF receiver. The signal processor is further configured to provide instructions to the tunable RF receiver to search for reception of a signal from the master node by tuning the slave frequency of the tunable RF receiver within a predetermined search band of frequencies, to provide an initial detected master frequency. The signal processor is further configured to instruct the tunable RF receiver to receive a calibration signal at the initial detected master frequency from the master node, the calibration signal containing time information or frequency information, or both. The signal processor is further configured to provide a frequency error of the RF oscillator frequency relative to the calibration signal by comparing information from the calibration signal to a corresponding signal from the RF oscillator to tune the RF oscillator frequency to the master frequency to enable communication between the slave node and the master node at the tuned RF oscillator frequency.

Another aspect of the present disclosure is to provide a wireless slave node for a wireless network system. The slave node includes a tunable radiofrequency (RF) receiver configured to be in wireless communication with a master node and to receive at a slave frequency, the master node being configured to transmit at a master frequency; and an RF oscillator configured to communicate with the tunable RF receiver, the RF oscillator being configured to communicate an RF oscillator frequency to the RF receiver to determine and tune the slave frequency. The slave node also includes a signal processor configured to communicate with the tunable RF receiver. The signal processor is further configured to provide instructions to the tunable RF receiver to search for reception of a signal from the master node by tuning the slave frequency of the tunable RF receiver within a predetermined search band of frequencies, to provide an initial detected master frequency. The signal processor is further configured to instruct the tunable RF receiver to receive a calibration signal at the initial detected master frequency from the master node, the calibration signal containing time information or frequency information, or both. The signal processor is further configured to provide a frequency error of the RF oscillator frequency relative to the calibration signal by comparing information from the calibration signal to a corresponding signal from the RF oscillator to tune the RF oscillator frequency to the frequency of the master node to enable communication between the slave node and the master node at the tuned RF oscillator frequency.

A further aspect of the present disclosure is to provide a wireless slave node for a wireless network system. The wireless slave node includes a tunable RF transmitter configured to be in wireless communication with a master node and to transmit at a first slave frequency; and a tunable RF receiver configured to be in wireless communication with the master node and to receive at a second slave frequency. The slave node further includes an RF oscillator configured to communicate with the tunable RF receiver and the tunable RF transmitter, the RF oscillator being configured to communicate an RF oscillator frequency to the tunable RF transmitter and to the tunable RF receiver to determine and tune the first and second slave frequencies. The RF oscillator is configured to receive calibration information comprising time information or frequency information, or both, from a reference node, wherein the RF oscillator frequency of the RF oscillator is tuned based on the calibration information from the reference node to enable communication between the slave node and the master node at the tuned RF oscillator frequency.

Another aspect of the present disclosure is to provide a method of tuning a communication frequency of a slave node to a communication frequency of a master node, the master node comprising a master radio frequency (RF) transmitter configured to transmit at a master frequency, the master frequency being generated by the master node using a master clock. The method includes searching, by the slave node, for reception of a signal from the master node by tuning a slave frequency of a tunable RF receiver of the slave node within a predetermined search band of frequencies to provide an initial detected master frequency, the slave frequency corresponding to an RF frequency provided by an RF oscillator in the slave node; receiving, by the slave node, a calibration signal at the initial detected master frequency from the master node, the calibration signal containing time information or frequency information, or both; determining, by the slave node, a frequency error between the calibration signal containing the time information or frequency information, or both, and the slave frequency; and tuning, by the slave node, the slave frequency to the frequency of the master node based on the frequency error to enable communication between the slave node and the master node at the tuned slave frequency.

Yet another aspect of the present disclosure is to provide a method of communicating over a wireless network. The method includes transmitting RF calibration information from a master node; tuning an RF receiver of a slave node within a preselected frequency band to receive the RF calibration information from the master node; tuning an RF transmitter of the slave node using the RF calibration information from the master node; and transmitting local information from the slave node subsequent to the tuning the RF transmitter such that at least the master node or at least one other slave node is able to receive the local information. The tuning of the RF transmitter of the slave node comprises tuning an RF oscillator of the slave node.

BRIEF DESCRIPTION OF THE DRAWINGS

The present disclosure, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of "a", "an", and "the" include plural referents unless the context clearly dictates otherwise.

DETAILED DESCRIPTION

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the current invention.

Figure 1:
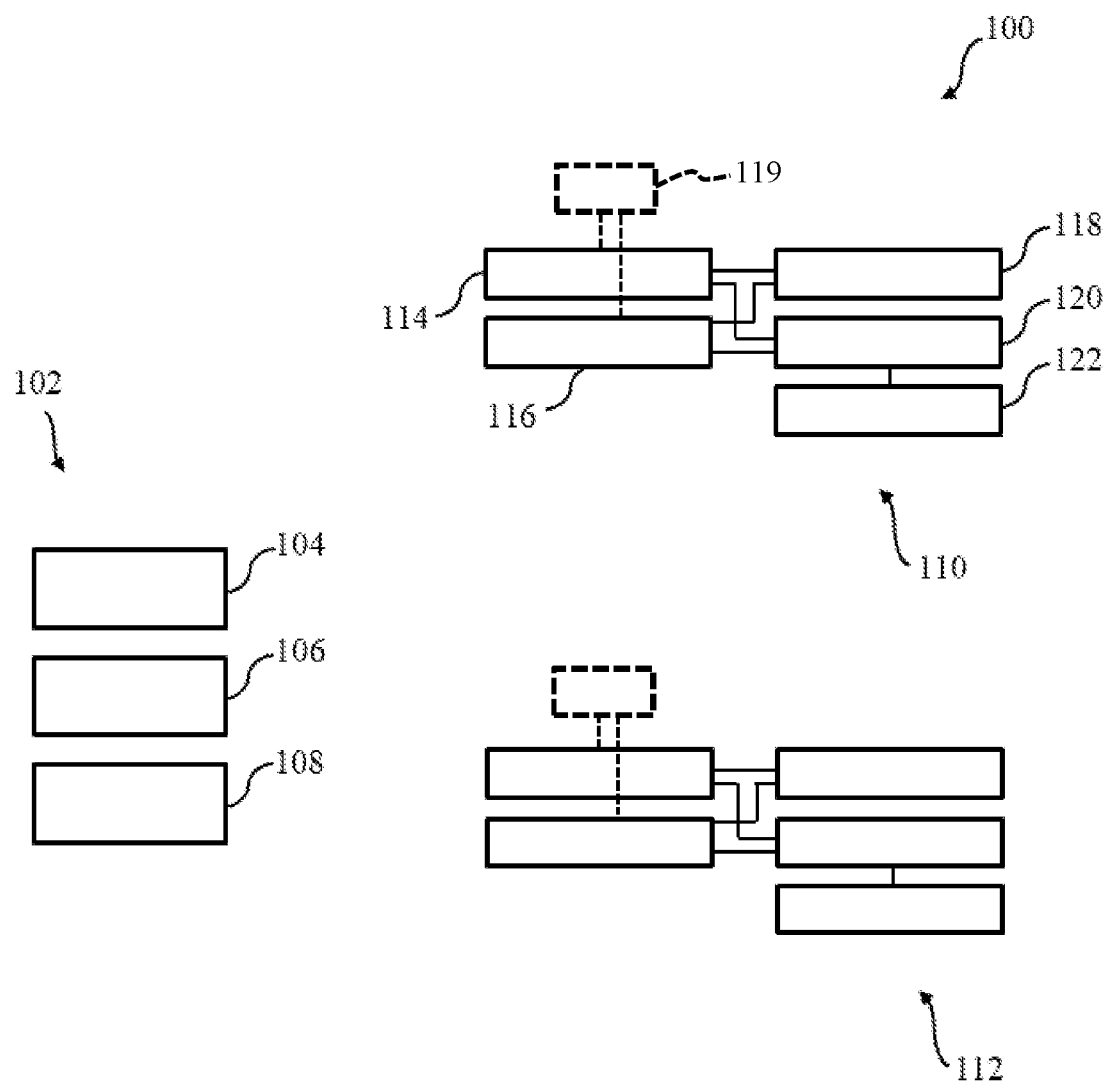
FIG. 1 shows a schematic diagram of a wireless network, according to some embodiments of the present disclosure.

FIG. 1 shows a schematic diagram of a wireless network, according to some embodiments of the present disclosure. In an embodiment, the wireless network 100 includes a master node 102 and a slave node 110, 112. The master node 102 includes a master radio frequency (RF) transmitter 104 that is configured to transmit at a master frequency. The master frequency is generated by the master node 102 using a master clock 108. In an embodiment, the master clock 108 comprises a quartz or microelectromechanical systems (MEMs) oscillator.

In the following paragraphs, the wireless network 100 will be described by referring to the slave node 110. However, as it can be appreciated, the same or similar description can also be applied to the slave node 112. The slave node 110 includes a tunable RF receiver 116 that is configured to be in wireless communication with the master node and to receive at a slave receive frequency. In an embodiment, the slave node 110 may further include a tunable RF transmitter 114 that is configured to be in wireless communication with the master node 102 and to transmit at a slave transmit frequency. In an embodiment, the slave receive frequency of the tunable RF receiver 116 is substantially the same as the slave transmit frequency of the tunable RF transmitter 114. However, the slave receive frequency and the slave transmit frequency can also be different. For example, a difference of a few MHz (e.g., 2.5 MHz) can exist between the slave transmit frequency and the slave receive frequency.

The slave node 110 also includes an RF oscillator 118 that is configured to communicate with the tunable RF receiver 116. The RF oscillator may also be configured to communicate with the tunable RF transmitter 114. The RF oscillator 118 is configured to communicate an RF oscillator frequency to at least the tunable RF receiver 116 to determine and tune the slave frequency. In an embodiment, the RF oscillator 118 is configured to communicate the RF oscillator frequency to both the tunable RF transmitter 114 and the tunable RF receiver 116. In another embodiment, the RF oscillator 118 may include a first RF oscillator configured to communicate with the tunable RF receiver 116 and a second RF oscillator configured to communicate with the tunable RF transmitter 114. The first and second RF oscillators of the RF oscillator 118 are configured to communicate frequency information to the tunable RF receiver 116 and to the tunable RF transmitter 114, respectively, to determine and tune the slave frequency of the tunable RF receiver 116 and the slave frequency of the tunable RF transmitter 114.

The slave node 110 also includes a signal processor 120 that is configured to communicate with the tunable RF receiver 116. The signal processor 120 can be a digital or an analog circuit. In an embodiment, the signal processor may also be configured to communicate with the tunable RF transmitter 114. In an embodiment, the signal processor 120 is further configured to provide instructions to the tunable RF receiver 116 to search for reception of a signal from the master node 102 by tuning the slave frequency of the tunable RF receiver 116 within a predetermined search band of frequencies to provide an initial detected master frequency. In an embodiment, the signal processor 120 is further configured to instruct the tunable RF receiver 116 to receive a calibration signal at the initial detected master frequency from the master node 102. The calibration signal may contain time information or frequency information, or both. For example, in an embodiment, the calibration signal may contain time information in a form of two beacon signals transmitted at two different point in time. The two beacon signals may have the same frequency. In another embodiment, the calibration signal may contain a first signal at a first frequency, transmitted at a first point in time and a second signal at a second frequency, transmitted at a second point time. The first point in time and the second point in time can be the same or different.

The signal processor 120 is further configured to provide a frequency error of the RF oscillator frequency relative to the calibration signal by comparing information from the calibration signal to a corresponding signal from the RF oscillator 118 to tune the RF oscillator frequency to the frequency of the master node 102 to enable communication between the slave node 110 and the master node 102 at the tuned RF oscillator frequency. In an embodiment, the frequency error of the RF oscillator 118 can be computed by the signal processor 120 by comparing information from the calibration signal from the master node 102 to a corresponding signal from the RF oscillator 118. The computed frequency error can then be used to calculate a communicating frequency that more closely matches or approaches the master frequency than the initial detected master frequency.

In another embodiment, the frequency error may not need to be computed. In this case, for example, the frequency error can be provided in a form of a direction or a sign "+" or sign "−" which can be coded as a "bit charge pump." Hence, the error can be provided as an information of the slave frequency being greater "+" than the master frequency or smaller "−" than the master frequency. The slave frequency can decrease its frequency if the slave frequency is greater than the master frequency or increase its frequency if the slave frequency is smaller than the master frequency and repeat this operation a plurality of times until the slave frequency is tuned to the master frequency.

In an embodiment, the RF oscillator 118 includes a relaxation oscillator circuit or a LC circuit (LC tank), or both. In an embodiment, the tunable RF receiver 116 and the RF oscillator 118 are structured as a single-chip semiconductor device on one semiconductor die. In another embodiment, the tunable RF receiver 116, the tunable RF transmitter 114 and the RF oscillator 118 are structured as a single-chip semiconductor device on one semiconductor die. For example, the single-chip semiconductor device is a complementary metal-oxide semiconductor (CMOS) device. In an embodiment, the slave node 110 may also include an antenna electrically connected to the tunable RF receiver 116. The antenna may also be connected to the tunable RF transmitter 114. Alternatively, a separate antenna may be connected to the tunable RF transmitter 114. The antenna can be provided on the single-chip semiconductor device on the one semiconductor die. In an embodiment, the slave node 110 further includes a source of electrical energy in electrical connection with the tunable RF receiver 116 and the RF oscillator 118 to power the slave node 110. In another embodiment, the source of electrical energy is in electrical connection with the tunable RF receiver 116, the tunable RF transmitter 114, and the RF oscillator 118 to power the slave node 110. In an embodiment, the source of electrical energy is a further structure on the single-chip semiconductor device on the one semiconductor die. In an embodiment, the source of electrical energy may include an energy scavenging structure that extracts energy from a local environment of the wireless slave node. The energy scavenging structure can be, for example, a photovoltaic cell. In an embodiment, the slave node 110 further includes an energy storage structure in electrical connection with the source of electrical energy. The energy storage structure can be, for example, a battery. In an embodiment, the slave node 110 further includes an energy storage structure in electrical connection with the source of electrical energy. The energy storage structure can be, for example, a thin-film battery printed onto the single-chip semiconductor device.

In an embodiment, the slave node 110 may also include a memory device configured to communicate with the signal processor 120 to store the tuned RF oscillator frequency. In an embodiment, the slave node may also include a local clock 119 that is configured to communicate with the tunable RF receiver 116 to provide timing information to the tunable RF receiver 116. In an embodiment, the local clock 119 may also communicate with the tunable RF transmitter 114 to provide timing information to the tunable RF transmitter 114. In an embodiment, the local clock 119 is configured to receive a calibration signal from the master node 102. The calibration signal may contain time information or frequency information, or both, to tune the local clock 119 to the master clock 108 of the master node. In an embodiment, the local clock 119 comprises a low frequency oscillator having a lower frequency than the RF oscillator frequency of the RF oscillator 118.

Figure 2:
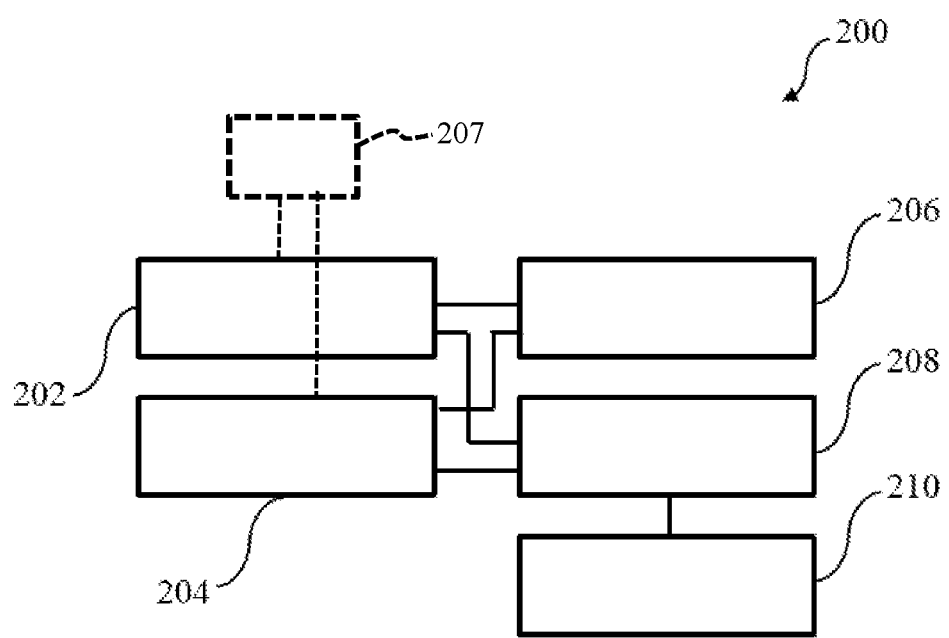
FIG. 2 depicts a schematic diagram of a wireless slave node for a wireless network system, according to some embodiments of the present disclosure.

FIG. 2 depicts a schematic diagram of a wireless slave node for a wireless network system, according to some embodiments of the present disclosure. The slave node 200 includes a tunable RF receiver 204 that is configured to be in wireless communication a master node and to receive at a slave receive frequency. In an embodiment, the slave node 200 may further include a tunable RF transmitter 202 that is configured to be in wireless communication with the master node and to transmit at a slave transmit frequency. In an embodiment, the slave receive frequency of the tunable RF receiver 204 is substantially the same as the slave transmit frequency of the tunable RF transmitter 202. However, the slave receive frequency and the slave transmit frequency can also be different. For example, a difference of a few MHz (e.g., 2.5 MHz) can exist between the slave transmit frequency and the slave receive frequency.

The slave node 200 also includes an RF oscillator 206 that is configured to communicate with the tunable RF receiver 204. The RF oscillator 206 may also be configured to communicate with the tunable RF transmitter 202. The RF oscillator 206 is configured to communicate an RF oscillator frequency to at least the tunable RF receiver 204 to determine and tune the slave frequency. In an embodiment, the RF oscillator 206 is configured to communicate the RF oscillator frequency to both the tunable RF transmitter 202 and the tunable RF receiver 204. In another embodiment, the RF oscillator 206 may include a first RF oscillator configured to communicate with the tunable RF receiver 204 and a second RF oscillator configured to communicate with the tunable RF transmitter 202. The first and second RF oscillators of the RF oscillator 206 are configured to communicate frequency information to the tunable RF receiver 204 and to the tunable RF transmitter 202, respectively, to determine and tune the slave frequency of the tunable RF receiver 204 and the slave frequency of the tunable RF transmitter 202.

The slave node 200 also includes a signal processor 208 that is configured to communicate with the tunable RF receiver 204. The signal processor 208 can be a digital or an analog circuit. In an embodiment, the signal processor 208 may also be configured to communicate with the tunable RF transmitter 202. In an embodiment, the signal processor 208 is further configured to provide instructions to the tunable RF receiver 204 to search for reception of a signal from the master node by tuning the slave frequency of the tunable RF receiver 204 within a predetermined search band of frequencies to provide an initial detected master frequency. In an embodiment, the signal processor 208 is further configured to instruct the tunable RF receiver 204 to receive a calibration signal at the initial detected master frequency from the master node. The calibration signal may contain time information or frequency information, or both. For example, in an embodiment, the calibration signal may contain time information in a form of two beacon signals transmitted at two different point in time. The two beacon signals may have the same frequency. In another embodiment, the calibration signal may contain a first signal at a first frequency, transmitted at a first point in time and a second signal at a second frequency, transmitted at a second point time. The first point in time and the second point in time can be the same or different.

The signal processor 208 is further configured to provide a frequency error of the RF oscillator frequency relative to the calibration signal by comparing information from the calibration signal to a corresponding signal from the RF oscillator 206 to tune the RF oscillator frequency to the frequency of the master node to enable communication between the slave node 200 and the master node at the tuned RF oscillator frequency. In an embodiment, the frequency error of the RF oscillator 206 can be computed by the signal processor 208 by comparing information from the calibration signal from the master node to a corresponding signal from the RF oscillator 206. The computed frequency error can then be used to calculate a communicating frequency that more closely matches or approaches the master frequency than the initial detected master frequency.

In another embodiment, the frequency error may not need to be computed. In this case, for example, the frequency error can be provided in a form of a direction or a sign "+" or sign "−" which can be coded as a "bit charge pump." Hence, the error can be provided as an information of the slave frequency being greater "+" than the master frequency or smaller "−" than the master frequency. The slave frequency can decrease its frequency if the slave frequency is greater than the master frequency or increase its frequency if the slave frequency is smaller than the master frequency and repeat this operation a plurality of times until the slave frequency is tuned to the master frequency.

In an embodiment, the RF oscillator 206 includes a relaxation oscillator circuit or a LC circuit (LC tank), or both. In an embodiment, the tunable RF receiver 204 and the RF oscillator 206 are structured as a single-chip semiconductor device on one semiconductor die. In another embodiment, the tunable RF receiver 204, the tunable RF transmitter 202 and the RF oscillator 206 are structured as a single-chip semiconductor device on one semiconductor die. For example, the single-chip semiconductor device is a complementary metal-oxide semiconductor (CMOS) device. In an embodiment, the slave node 200 may also include an antenna electrically connected to the tunable RF receiver 204. The antenna may also be connected to the tunable RF transmitter 202. Alternatively, a separate antenna may be connected to the tunable RF transmitter 202. The antenna can be provided on the single-chip semiconductor device on the one semiconductor die. In an embodiment, the slave node 200 further includes a source of electrical energy in electrical connection with the tunable RF receiver 204 and the RF oscillator 206 to power the slave node 200. In another embodiment, the source of electrical energy is in electrical connection with the tunable RF receiver 204, the tunable RF transmitter 202, and the RF oscillator 206 to power the slave node 200. In an embodiment, the source of electrical energy is a further structure on the single-chip semiconductor device on the one semiconductor die. In an embodiment, the source of electrical energy may include an energy scavenging structure that extracts energy from a local environment of the wireless slave node. The energy scavenging structure can be, for example, a photovoltaic cell. In an embodiment, the slave node 200 further includes an energy storage structure in electrical connection with the source of electrical energy. The energy storage structure can be, for example, a battery. In an embodiment, the slave node 200 further includes an energy storage structure in electrical connection with the source of electrical energy. The energy storage structure can be, for example, a thin-film battery printed onto the single-chip semiconductor device.

In an embodiment, the slave node 200 may also include a memory device configured to communicate with the signal processor 208 to store the tuned RF oscillator frequency. In an embodiment, the slave node 200 may also include a local clock 207 that is configured to communicate with the tunable RF receiver 204 to provide timing information to the tunable RF receiver 204. In an embodiment, the local clock 207 may also communicate with the tunable RF transmitter 202 to provide timing information to the tunable RF transmitter 202. In an embodiment, the local clock 207 is configured to receive a calibration signal from the master node. The calibration signal may contain time information or frequency information, or both, to tune the local clock 207 to a master clock of the master node. In an embodiment, the local clock 207 comprises a low frequency oscillator having a lower frequency than the RF oscillator frequency of the RF oscillator 206.

In the above paragraphs, it is described that the calibration signal or calibration information is provided by the master node. However, it must be appreciated that the calibration signal or calibration information can be provided by a reference node which can be the master node or can also be any other reference node including, but not limited to, GPS satellite, mobile cellular tower, FM radio, TV and/or the atomic clock. Therefore, the calibration information or calibration signal can include calibration information from the master node, calibration information from a GPS signal, calibration information from mobile cellular signal, calibration information from a FM radio signal, calibration information from a TV signal, calibration information from the atomic clock signal, or any combination thereof.

As it can be appreciated from the above paragraphs, there is also provided, according to an embodiment of the present disclosure, a method of tuning a communication frequency of a slave node (e.g., slave node 110) to a communication frequency of a master node (e.g., master node 102), the master node 102 having a master RF transmitter 104 configured to transmit at a master frequency, the master frequency being generated by the master node 102 using the master clock 108. The method includes searching, by the slave node 110, for reception of a signal from the master node 102 by tuning a slave frequency of a tunable RF receiver 116 of the slave node 110 within a predetermined search band of frequencies to provide an initial detected master frequency, the slave frequency corresponding to an RF frequency provided by an RF oscillator 118 in the slave node 110. The method further includes receiving, by the slave node 110, a calibration signal at the initial detected master frequency from the master node 102, the calibration signal containing time information or frequency information, or both, and determining, by the slave node 110, a frequency error between the calibration signal containing the time information or frequency information, or both, and the slave frequency. The method also includes tuning, by the slave node 110, the slave frequency to the frequency of the master node 102 based on the frequency error to enable communication between the slave node 110 and the master node 102 at the tuned slave frequency.

In an embodiment, the determining of the frequency error between the calibration signal and the slave frequency includes computing a frequency error of the RF oscillator 118 by comparing information from the calibration signal from the master node 102 to a corresponding signal from the RF oscillator 118 to calculate a communicating frequency that more closely matches the master frequency than the initial detected master frequency. In an embodiment, the tuning of the slave frequency to the frequency of the master node 102 comprises correcting for the frequency error between the calibration signal and the slave frequency.

As it can be appreciated from the above paragraphs, there is further provided another method of communicating over a wireless network, according to an embodiment of the present disclosure. The method includes transmitting RF calibration information from a master node 102, and tuning an RF receiver 116 of a slave node 110 within a preselected frequency band to receive the RF calibration information from the master node 102. The method further includes tuning an RF transmitter 114 of the slave node using the calibration information from the master node 102, and transmitting local information from the slave node 110 subsequent to the tuning the RF transmitter 114 such that at least the master node 102 or at least one other slave node 112 is able to receive the local information. The tuning of the RF transmitter 114 of the slave node 110 comprises tuning an RF oscillator 118 of the slave node 110.

In an embodiment, the method further includes tuning an RF receiver of a second slave node 112 within the preselected frequency band to receive the RF calibration information from the master node 102. The tuning of the RF transmitter of the second slave node 112 includes tuning of an RF oscillator of the second slave node. In an embodiment, the method also includes transmitting local information from at least one of the first-mentioned slave node 110 or the second slave node 112 subsequent to the tuning the corresponding RF transmitter such that local information is transmitted therebetween. In an embodiment, tuning the RF oscillator comprises tuning a frequency of the RF oscillator based on the calibration information from the master node 102 to enable communication between at least the slave node 110, 112 and the master node 102 at the tuned RF oscillator frequency.

The following paragraphs describe various examples of implementations of the above described wireless network and various implementations of the slave node. However, it must be appreciated that the disclosure is not limited to the implementations described herein but encompasses other configurations. The term "master node" is intended to have a broad interpretation, including but not limited to a root node, a node having a crystal reference, or a node transmitting a calibration signal containing time information or frequency information, or both. The term "slave node" is intended to have a broad interpretation, including but not limited to, a wireless sensor node. The term "slave node" is intended to have a broad interpretation, including but not limited to dedicated digital logic, a microprocessor, an electronic processor, or a processor configured to execute commands stored in software, etc.

As it can be appreciated from the following paragraphs, there is provided a crystal free sensor node designed in the absence of a crystal reference. In an embodiment of the present disclosure, the nodes in the wireless network operate in a Time-Synchronized Mesh Protocol (TSMP) with at least one node in the network having a crystal reference (K. Pister and Lance Doherty, "TSMP: Time synchronized mesh protocol," in TASTED Distributed Sensor Networks, 2008, pp. 391-398.)

In the absence of any quartz crystal oscillator, an on-chip relaxation oscillator is used as a frequency reference. For a frequency reference, the frequency stability and accuracy of the frequency reference are desired. There are several factors that contribute to frequency fluctuations of an oscillatory signal of an oscillator from its nominal oscillation frequency. These factors can be broadly categorized as short-term (within approximately seconds) and long-term (within approximately hours). The frequency fluctuations of the oscillator are caused due to random noise, deterministic environmental effects, and aging. The environmental effects include temperature, vibration, shock, power-supply variation, humidity, stress, etc. It is worthwhile to note that these effects occur at different time scales. A factor that is of interest is short-term frequency stability of a relaxation oscillator for a given power budget which limits its inherent frequency stability due to pure random noise.

The short-term frequency stability of relaxation oscillators, published in the literature as measured by the Allan deviation directly in the time domain, shows that beyond 1 second better than 20 ppm frequency stability is achieved at nW power for 18.5 KHz (A. Paidimarri, D. Griffith, A. Wang, A. P. Chandrakasan, and G. Burra, "A 120 nW 18.5 kHz RC oscillator with comparator offset cancellation for ±0.25% temperature stability," in Solid-State Circuits Conference Digest of Technical Papers (ISSCC), 2013 IEEE International, February 2013, pp. 184-185) and 33 KHz (D. Griffith, P. T. Roine, J. Murdock, and R. Smith, "A 190 nW 33 kHz RC oscillator with ±0.21% temperature stability and 4 ppm long-term stability," in Solid-State Circuits Conference Digest of Technical Papers (ISSCC), 2014 IEEE International, February 2014, pp. 300-301) for RC oscillators and <100 ppm for 11 Hz for RC oscillator beyond 100 seconds (Seokhyeon Jeong, Inhee Lee, D. Blaauw, and D. Sylvester, "A 5.8 nW CMOS Wake-Up Timer for Ultra-Low-Power Wireless Applications," Solid-State Circuits, IEEE Journal of, vol. 50, no. 8, pp. 1754-1763, August 2015). The frequency stability of relaxation oscillators is not limited by the pure random noise but is in fact due to environmental factors, e.g. temperature and supply voltage sensitivity. Measured temperature accuracy of ±2100 ppm (−20° C. to 90° C.) and ±1000 ppm (−20° C. to 100° C.) while voltage accuracy of 900 ppm and 600 ppm per volt has been reported (D. Griffith, P. T. Roine, J. Murdock, and R. Smith, "A 190 nW 33 kHz RC oscillator with ±0.21% temperature stability and 4 ppm long-term stability," in olid-State Circuits Conference Digest of Technical Papers (ISSCC), 2014 IEEE International, February 2014, pp. 300-301 and Keng-Jan Hsiao, "A 32.4 ppm/° C. 3.2-1.6V self-chopped relaxation oscillator with adaptive supply generation," in in VLSI Circuits (VLSIC), 2012 Symposium on, June 2012, pp. 14-15). Therefore, the sensitivity to environmental factors can set the lower limit on the frequency accuracy of the relaxation oscillators.

In an embodiment, after calibrating for static errors, e.g. process variations, approximately 1% (i.e., approximately 10000 ppm) initial frequency accuracy of relaxation oscillators can be achieved keeping environmental factors into account. For example, in a wireless network if one node (e.g., master node 102 shown in FIG. 1) has a crystal-referenced oscillator used as a clock (called Root clock), then all other nodes in the network can synchronize their local reference clock (relaxation oscillator) to the Root clock by exchanging packets and using time-stamp information to track their clock drift with respect to a crystal clock (Tengfei Chang, Thomas Watteyne, Kris Pister, and Qin Wang, "Adaptive synchronization in multi-hop TSCH networks," Computer Networks, vol. 76, pp. 165-176, January 2015). However, the problem with this approach is that in order for the nodes to initially communicate (listen) to a Root node to get the time information, the listening nodes need to tune their local oscillator (LO) to a precise RF frequency (typically <100 ppm accuracy) which can be achieved with an on-chip phase locked loop (PLL) using an accurate crystal based frequency reference.

An algorithm that allows a sensor node to communicate with a Root node with inaccurate frequency reference (~10000 ppm) is implemented. Once communication with a Root node (e.g., master node 102) is established and time-information exchanged, this initial frequency accuracy can be improved (<100 ppm) and in principle is limited only by the noise of the relaxation oscillators for a given power as quantified by the Allan deviation and the time synchronization algorithm accuracy.

Figure 3:
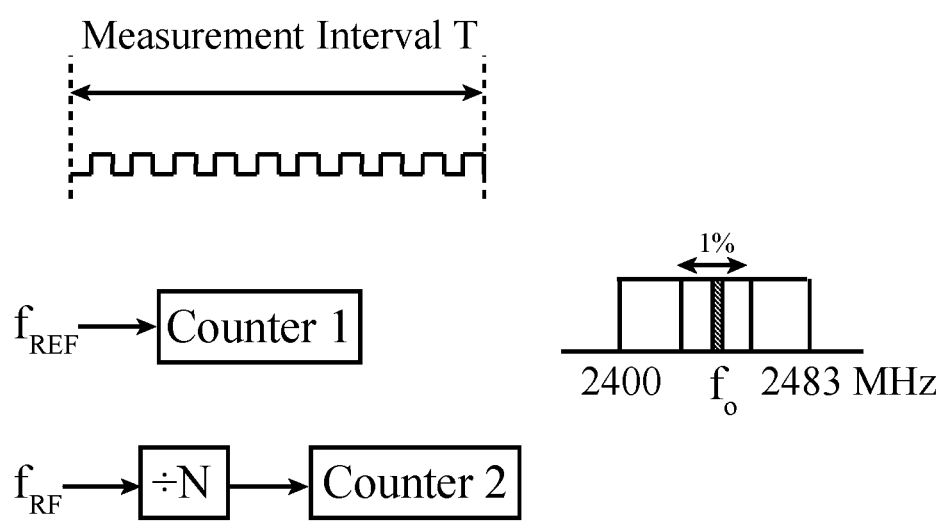
FIG. 3 depicts a measurement interval T defined by a number N1 count of Counter 1 in an internet-of-things (IoT) sensor node that can employ simple counters for an on-chip frequency measurement of RF (LC/Ring) oscillators to tune their frequency, according to an embodiment of the present disclosure.

An internet-of-things (IoT) sensor node can employ simple counters for an on-chip frequency measurement of RF (LC/Ring) oscillators to tune their frequency, as shown in FIG. 3. As depicted in FIG. 3, the measurement interval T is defined by the number N1 count of "counter 1". The RF frequency $f_{RF}$ can be estimated by using equation (1).

$$f_{RF} = \frac{N \times N2}{N1} f_{REF}. \quad (1)$$

where N2 is a count value of "counter 2" for the interval T. The number N is the frequency divide value for the RF frequency. The accuracy with which the RF frequency $f_{RF}$ can be determined is dictated by the accuracy of the reference frequency $f_{REF}$. The accuracy can be initially assumed to be approximately 1%. The 2.4 GHz ISM band is approximately 83 MHz wide which correspond to 3.4% of the band center frequency of 2450 MHz. With 1% frequency accuracy all the nodes in the network are guaranteed to find the 2.4 GHz ISM band and can tune their local oscillators or LOs to be within about 1% (i.e., within about 24.5 MHz) of the desired channel as illustrated in FIG. 3.

Depending on a communication channel bandwidth (communication between the master node 102 and the slave node 110, 112), a frequency resolution (ΔR) can be selected to tune the RF frequency of an IoT sensor node (slave node) that guarantees to find the Root node (master node 102) transmit frequency in the 24.5 MHz search band (SB) in a reasonable time. Therefore, the number of potential RF channels to search would be calculated by dividing the search band SB by the frequency resolution ΔR (i.e., SB/ΔR). For example, if the Root node (master node 102) sends a beacon signal every time period $T_B$ seconds on a predetermined RF channel then an IoT node (slave node 110) needs to listen at least 1.0202×$T_B$ seconds on each potential RF channel to guarantee finding a beacon signal if it happens to be on that frequency. The time period $T_B$ is defined with respect to a crystal clock (master clock 108 in the master node 102) and the factor 1.0202 takes into account the initial approximate 1% (10000 ppm) clock error with respect to a Root node master clock 108 in the master node 102. Therefore, the maximum time ($T_F$) that it would take for an IoT node to find the Root node (master node 102) is bounded by the following inequality (2). The number of potential RF channels to search SB/ΔR is multiplied by the time period 1.0202×$T_B$ seconds the IoT need to listen to define an upper limit or bound.

$$T_F < (1.0202 \times T_B) \times \frac{SB}{\Delta R}. \quad (2)$$

For example, if we assume a communication channel bandwidth of 2 MHz then a frequency resolution of ΔR=0.5 MHz is acceptable and with a beacon interval of $T_B$=1 second, the maximum time it would take for an IoT node (slave node 110) to find the root node (master node 102) transmit frequency would be less than 50 seconds (<50 seconds). Once communication with a Root node (master node 102) is established, an IoT node (slave node 110 or 112) can then calculate its frequency error by receiving a calibration signal containing time information for at least two time instants. According to some embodiments, the calibration signal can be two beacon signals from the Root node separated in time by $T_B$ seconds, though the embodiments of the invention are not limited to this example. According to some embodiments, each beacon packet contains the precise time-stamp in terms of counter value $c_R(t)$ of the Root node's clock. An IoT node can then compare this counter value against its own counter value $c_N(t)$ to estimate the current average relative frequency error by using equation (3) which can be derived from (Thomas Schmid, Roy Shea, Zainul Charbiwala, and and Mani B. Srivastava Jonathan Firedman, "On the Interaction of Clocks, Power, and Synchronization in Duty-Cycled Embedded Sensor Nodes," ACM Transactions on Sensor Networks (TOSN), vol. 7, no. 3, September 2010).

$$f_{err} = \frac{\{c_R(t=T_B) - c_N(t=t_B)\} - \{c_R(t=0) - c_N(t=0)\}}{c_R(t=T_B) - c_R(t=0)} \quad (3)$$

The minimal resolution for frequency error estimation is given by the following equation (4).

$$\delta f_{err} = \frac{1}{f_{REF} T_B} \quad (4)$$

where $f_{REF}$ is the clock frequency used for the digital counters and $T_B$ is the time interval used for synchronization between the two nodes. The accuracy of the frequency error estimation is limited by the rate at which the environmental factors change over the period of time $T_B$. Therefore, a tradeoff exists between frequency error resolution and the error introduced by the environmental factors over the period of time $T_B$. The parameter or factor $T_B$ can be adapted dynamically for a particular environmental condition. The synchronization interval $T_B$ should be long enough to meet the desired average fractional frequency accuracy specification while short enough to calibrate out the relatively slow varying environmental factors, as expressed by the following inequality (5).

$$T_{Resolution\ error} < T_B < T_{Environmental\ factors'\ error} \quad (5)$$

The resulting estimate of the frequency error can then be used to calibrate and tune the RF oscillator frequency with improved accuracy using Equation (1).

Figure 4:
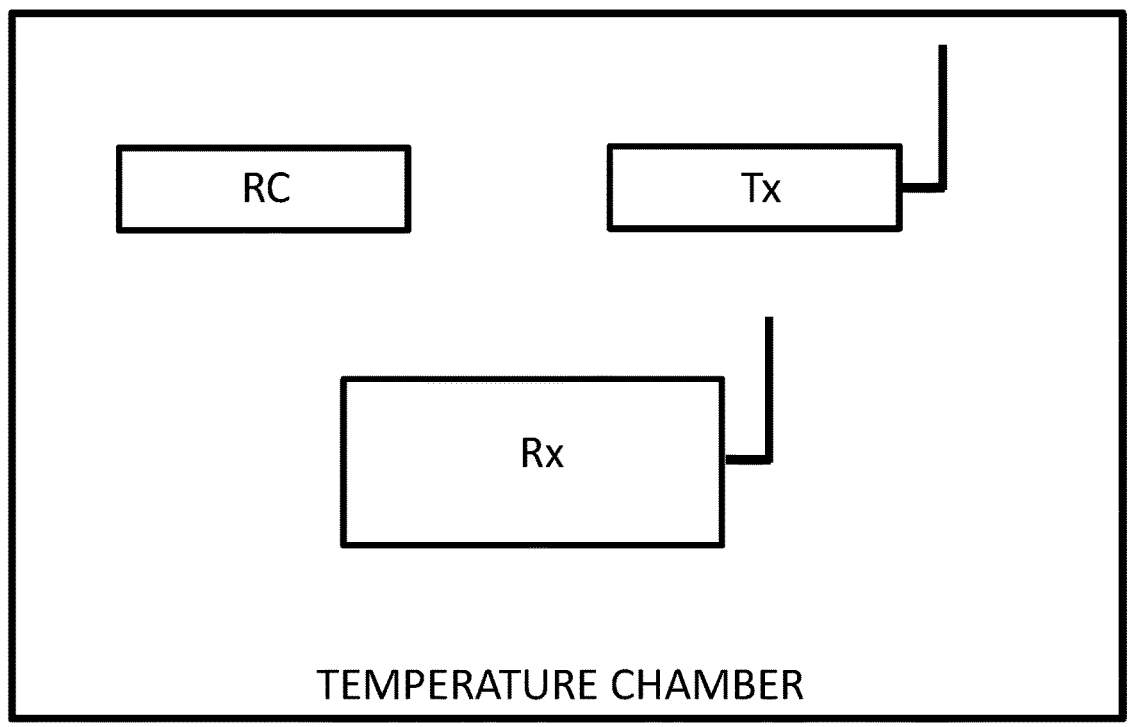
FIG. 4 is a measurement set-up for a first experiment; according to an embodiment of the present disclosure.

Commercial off-the-shelf hardware platform OpenMote by OpenMote Technologies of Spain was used to verify the feasibility of the frequency calibration algorithm. The measurement setup for the first experiment is shown in FIG. 4. There are three motes. One is configured as a transmitter (Tx), the other two motes (RC mote and Rx mote) emulate a crystal free wireless node. Two motes are needed to emulate a crystal free wireless node since commercial hardware platforms don't allow the radio to communicate without Xtal oscillator running. Therefore, one mote is configured as receiver (Rx) to communicate with the Tx mote while the other mote is configured as RC (Xtal oscillator disabled) on which relaxation oscillator is running. The three motes are placed inside a temperature chamber to exclude any temperature dependent frequency variation. The Tx mote is configured to periodically send RF packets with 100 ms time interval (synchronization interval) defined by a crystal clock that acts as a time reference for the network. The crystal free node (Rx and RC) is connected to a field-programmable gate array (FPGA). A counter is setup in the FPGA to measure the relaxation oscillator frequency. The Rx node sends an interrupt to the FPGA on receiving the RF packet from the Tx. The FPGA records the current value, resets the counter and the measurement is repeated.

Figure 5A:
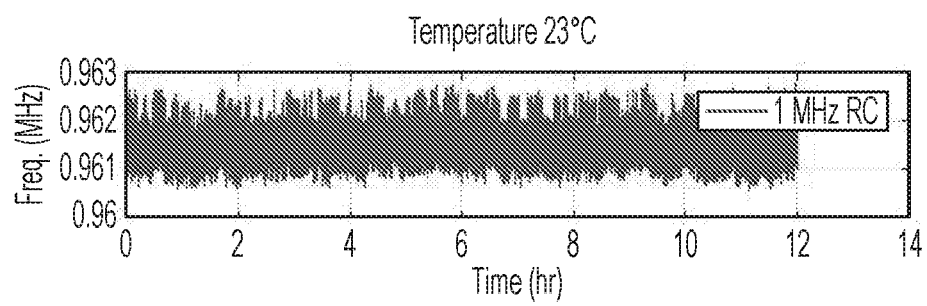
FIG. 5A is a plot of a measured RC oscillator frequency over 12 hrs at a constant temperature of 23° C., according to an embodiment of the present disclosure.
Figure 5B:
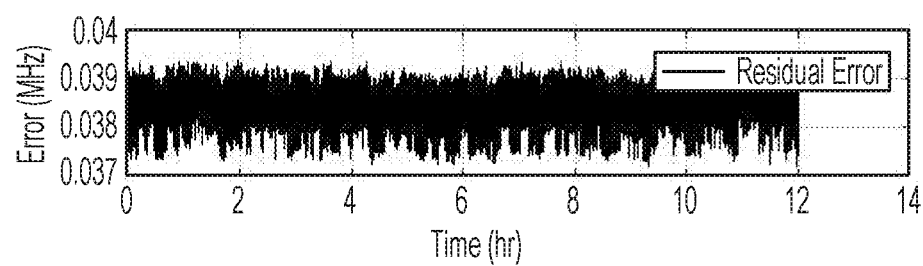
FIG. 5B is a plot of the estimated frequency error versus time, according to an embodiment of the present disclosure.
Figure 5C:
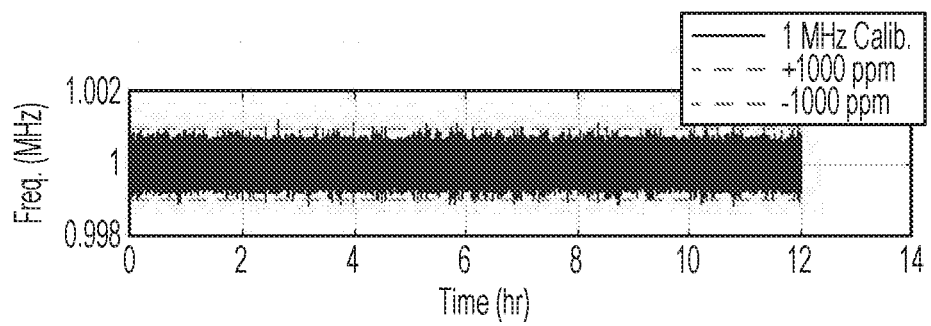
FIG. 5C is a plot of the calibrated RC oscillator frequency, according to an embodiment of the present disclosure.

FIG. 5A is a plot of a measured RC oscillator frequency over 12 hrs at a constant temperature of 23° C., according to an embodiment of the present disclosure. The counter value is recorded every 100 mS, which is then compared with its ideal value, and the frequency error is thus estimated. FIG. 5B is a plot of the estimated frequency error versus time, according to an embodiment of the present disclosure. The computed error is then used to calibrate the RC oscillator frequency. FIG. 5C is a plot of the calibrated RC oscillator frequency, according to an embodiment of the present disclosure. The maximum residual frequency error is less than 1000 ppm due to random noise. To demonstrate that the RC oscillator frequency can be calibrated for environmental factors, a fast temperature ramp was setup from 0° C. to 70° C. with a slope of 9° C./min. The synchronization interval is 100 mS.

Figure 6A:
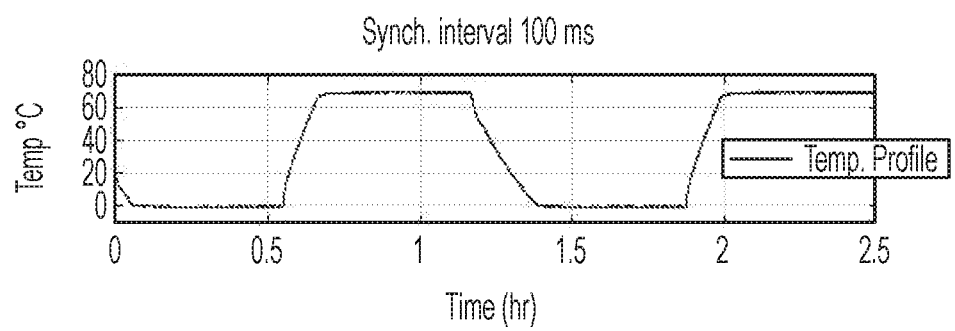
FIG. 6A is a plot showing the temperature ramp profile, according to an embodiment of the present disclosure.
Figure 6B:
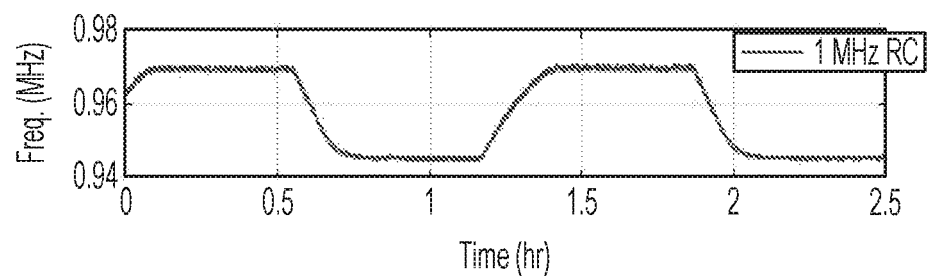
FIG. 6B is a plot showing the measured frequency of the relaxation oscillator, according to an embodiment of the present disclosure.
Figure 6C:
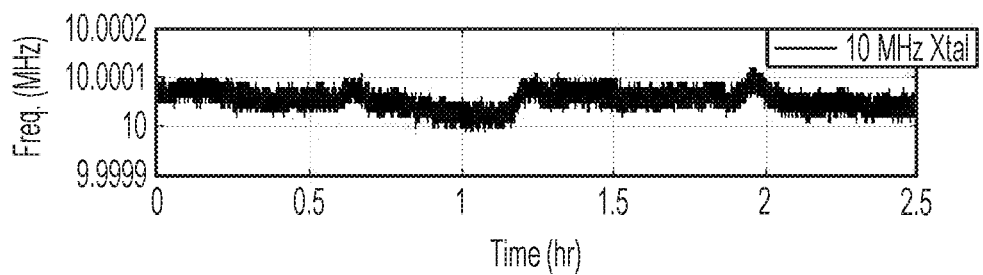
FIG. 6C is a plot showing a 10 MHz Xtal referenced frequency generated on an FPGA for comparison, according to an embodiment of the present disclosure.

FIG. 6A is a plot showing the temperature ramp profile, according to an embodiment of the present disclosure. FIG. 6B is a plot showing the measured frequency of the relaxation oscillator, according to an embodiment of the present disclosure. FIG. 6C is a plot showing a 10 MHz Xtal referenced frequency generated on an FPGA for comparison, according to an embodiment of the present disclosure. Note that the FPGA is not placed inside the temperature chamber and is not subjected to the temperature ramp.

Figure 7A:
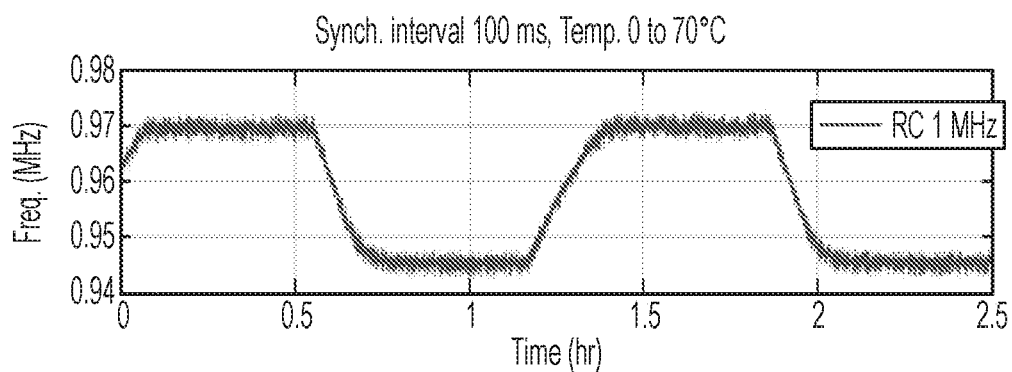
FIG. 7A shows the effect of temperature ramp on the RC oscillator frequency, according to an embodiment of the present disclosure.
Figure 7B:
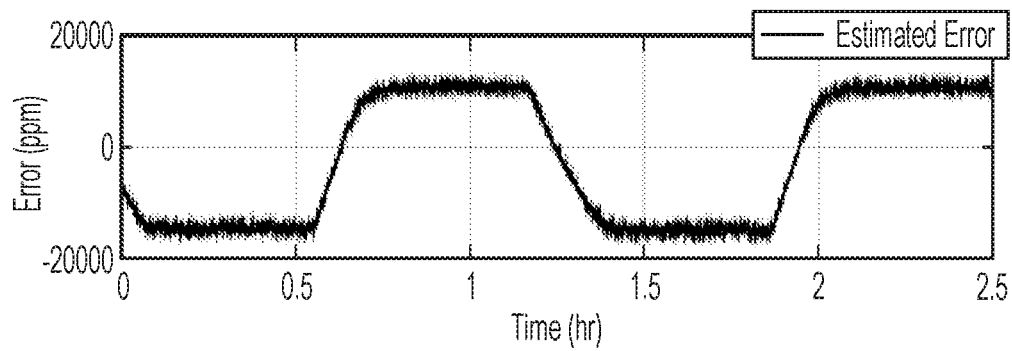
FIG. 7B shows the estimated frequency error and FIG. 7C shows the calibrated residual error in the RC oscillator frequency, according to an embodiment of the present disclosure.
Figure 7C:
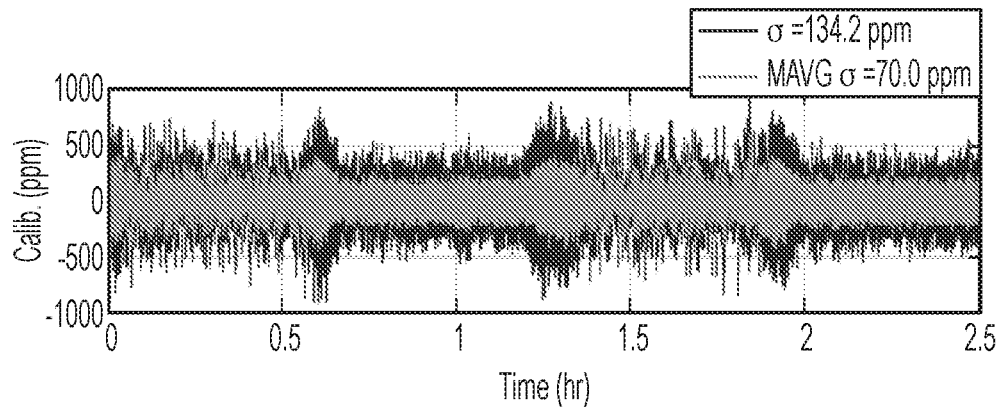

FIG. 7A shows the effect of temperature ramp on the RC oscillator frequency, FIG. 7B shows the estimated frequency error and FIG. 7C shows the calibrated residual error in the RC oscillator frequency, according to an embodiment of the present disclosure. The temperature ramp resulted in about 25,000 ppm frequency deviation which has been calibrated to less than 1000 ppm limited by the random noise. The standard deviation of the residual error is 134 ppm. A Finite Impulse Response (FIR) filter was then used to filter the residual frequency error. The FIR filter was designed to compute the cumulative moving average (MAVG) and the filtered response is plotted on top of the residual frequency error in the bottom plot. The FIR filter reduced the standard deviation to about 70 ppm.

Figure 8A:
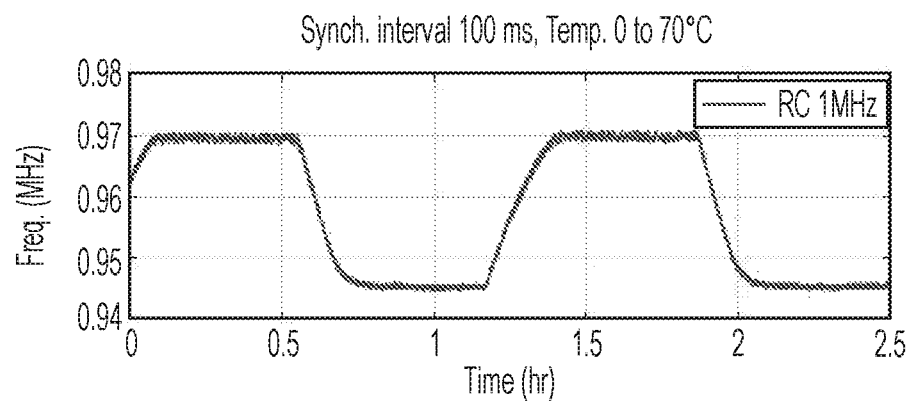
FIGS. 8A and 8B show the measured calibrated RC oscillator frequency reference with and without the FIR filter, respectively, according to an embodiment of the present disclosure.
Figure 8B:
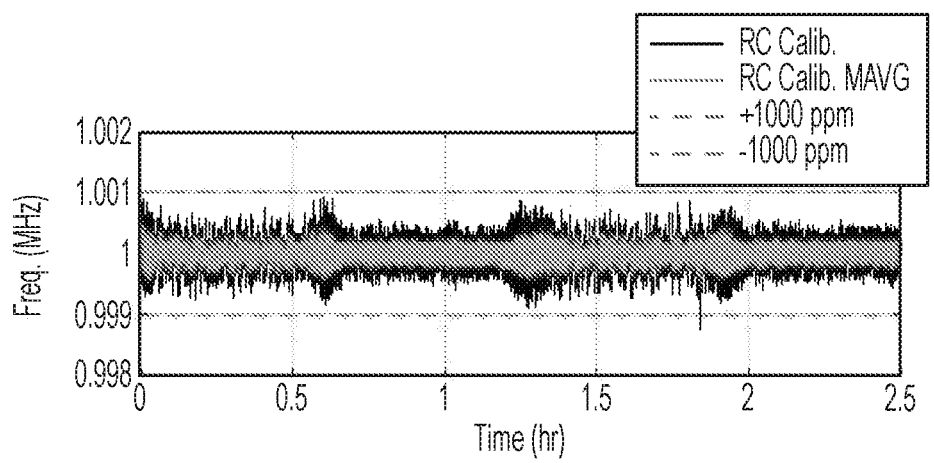

FIGS. 8A and 8B show the measured calibrated RC oscillator frequency reference with and without the FIR filter, respectively, according to an embodiment of the present disclosure. Now if the RC oscillators on two Xtal free nodes are calibrated with this accuracy then for 99.7% (three-sigma) of the cases the two motes will be off in frequency at most by 420 ppm. This corresponds to roughly 1 MHz for the 2.4 GHz ISM band. If the receiver acquisition range is designed to be greater than 1 MHz than the two crystal free motes will be able to communicate.

Figure 9:
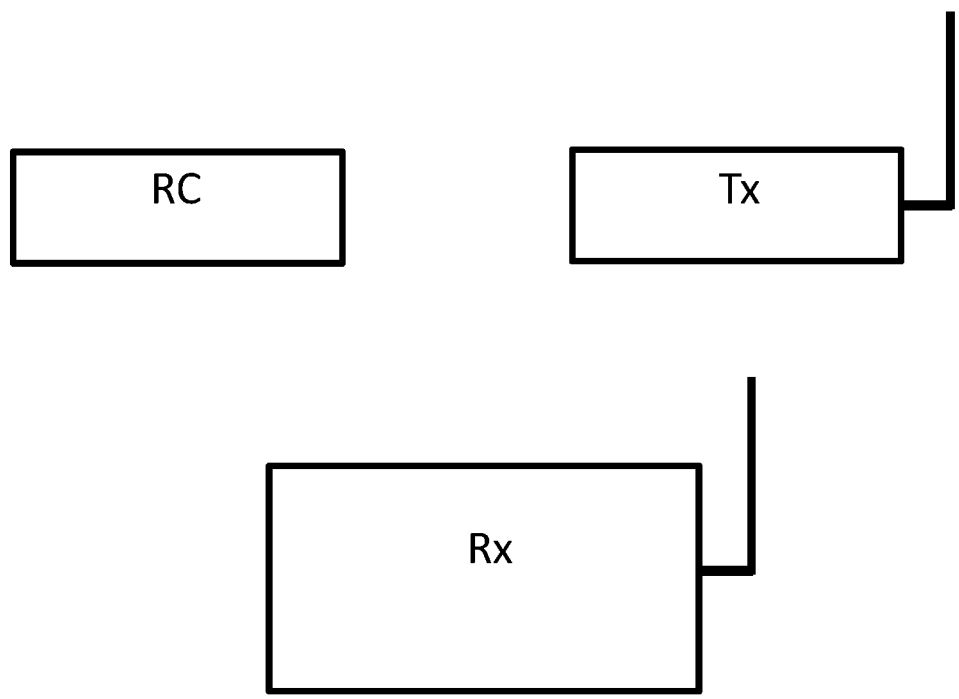
FIG. 9 shows a measurement setup to investigate the different synchronization intervals at room temperature, according to an embodiment of the present disclosure.

FIG. 9 shows a measurement setup to investigate the different synchronization intervals at room temperature, according to an embodiment of the present disclosure. The Tx and the crystal free mote (RC & Rx) are placed at a Line-of-Sight (LoS) distance of 1 m. The Tx is programmed to send periodic RF packets at synchronization interval from 100 ms up to 1000 ms with step size of 100 ms, as well as synchronization interval of 10 s and 100 s. The residual frequency error is still less than 1000 ppm limited only by random noise process for longer synchronization intervals at room temperature.

Figure 10:
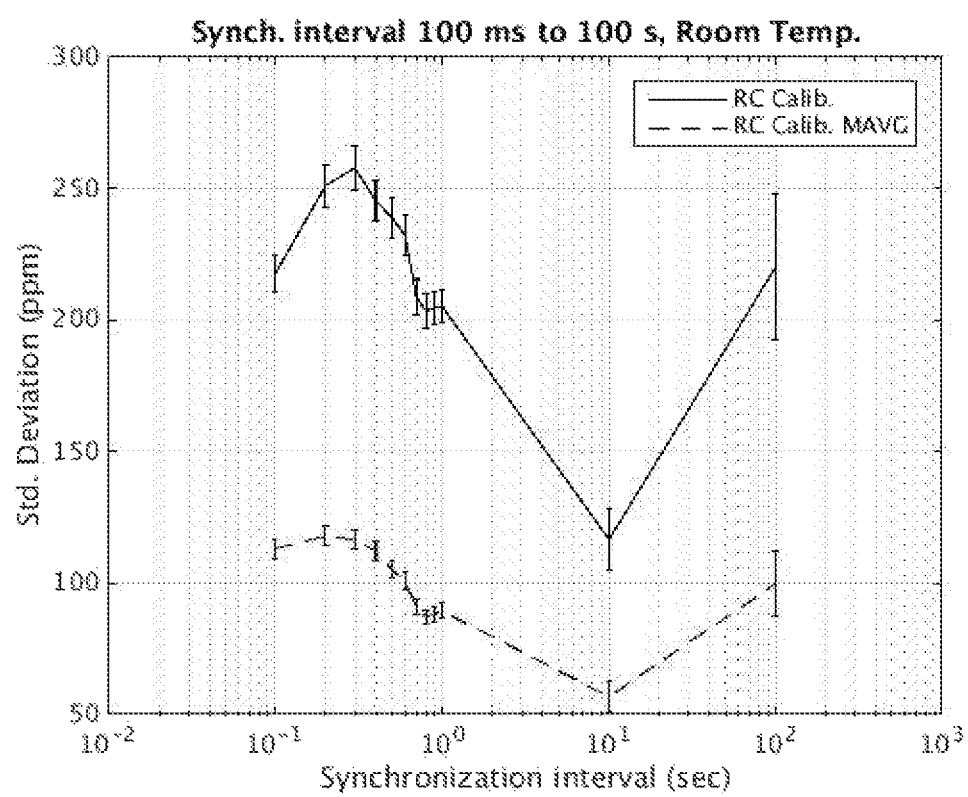
FIG. 10 shows a plot of the standard deviation corresponding to each synchronization interval with and without FIR filter, according to an embodiment of the present disclosure.

FIG. 10 shows a plot of the standard deviation corresponding to each synchronization interval with and without FIR filter, according to an embodiment of the present disclosure. The solid line corresponds to the RC calibration and the dashed line corresponds to a cumulative moving average (MAVG) of the RC calibration computed with a Finite Impulse Response (FIR) filter. The error bars are computed as reciprocal of the square root of the number of data points.

As it can be appreciated from the above paragraphs, a system solution is provided for a crystal free wireless communication in a time synchronized mesh networks. By exchanging time information with a Root node (master node 102) having a crystal time reference (master clock 108) the frequency error due to the environmental effects can be estimated and therefore calibrated for an on-chip RC oscillator. This enables wireless communication between two crystal free nodes.

The embodiments illustrated and discussed in this specification are intended only to teach those skilled in the art how to make and use the invention. In describing embodiments of the disclosure, specific terminology is employed for the sake of clarity. However, the disclosure is not intended to be limited to the specific terminology so selected. The above-described embodiments of the disclosure may be modified or varied, without departing from the invention, as appreciated by those skilled in the art in light of the above teachings. It is therefore to be understood that, within the scope of the claims and their equivalents, the invention may be practiced otherwise than as specifically described. For example, it is to be understood that the present disclosure contemplates that, to the extent possible, one or more features of any embodiment can be combined with one or more features of any other embodiment.

We claim:

1. A wireless network, comprising:
a master node comprising a master radio frequency (RF) transmitter configured to transmit at a master frequency, said master frequency being generated by said master node using a master clock; and
a slave node comprising:
a tunable RF receiver configured to be in wireless communication with said master node and to receive at a slave frequency;
an RF oscillator configured to communicate with the tunable RF receiver, the RF oscillator being configured to communicate an RF oscillator frequency to the tunable RF receiver to determine and tune the slave frequency;
a signal processor configured to communicate with said tunable RF receiver;
wherein said signal processor is further configured to provide instructions to said tunable RF receiver to search for reception of a signal from said master node by tuning said slave frequency of said tunable RF receiver within a predetermined search band of frequencies, to provide an initial detected master frequency,
wherein said signal processor is further configured to instruct said tunable RF receiver to receive a calibration signal at said initial detected master frequency from said master node, said calibration signal containing time information or frequency information, or both, and
wherein said signal processor is further configured to provide a frequency error of said RF oscillator frequency relative to said calibration signal by comparing information from said calibration signal to a corresponding signal from said RF oscillator to tune the RF oscillator frequency to the master frequency to enable communication between said slave node and said master node at said tuned RF oscillator frequency.

2. The wireless network according to claim 1, wherein said tunable RF receiver and said RF oscillator are structured as a single-chip semiconductor device on one semiconductor die.

3. The wireless network according to claim 2, wherein said single-chip semiconductor device is a complementary metal-oxide semiconductor (CMOS) device.

4. The wireless network according to claim 2, wherein the slave node further comprises an antenna electrically connected to said tunable RF receiver.

5. The wireless network according to claim 4, wherein said antenna is provided on said single-chip semiconductor device on said one semiconductor die.

6. The wireless network according to claim 1, wherein said slave node further comprises a source of electrical energy in electrical connection with said tunable RF receiver and said RF oscillator to power said slave node.

7. The wireless network according to claim 6, wherein said source of electrical energy is a further structure on said single-chip semiconductor device on said one semiconductor die.

8. The wireless network according to claim 7, wherein said source of electrical energy comprises an energy scavenging structure that extracts energy from a local environment of said slave node.

9. The wireless network according to claim 6, wherein said slave node further comprises an energy storage structure in electrical connection with said source of electrical energy, wherein said energy storage structure is a thin-film battery printed onto said single-chip semiconductor device.

10. The wireless network according to claim 1, further comprising a master RF receiver configured to receive at said master frequency.

11. The wireless network according to claim 1, further comprising a tunable RF transmitter configured to be in wireless communication with said master node and to transmit at a slave frequency.

12. The wireless network according to claim 11, wherein said slave frequency of said tunable RF receiver is substantially the same as said slave frequency of said tunable RF transmitter.

13. The wireless network according to claim 12, wherein the RF oscillator comprises a first RF oscillator configured to communicate with the tunable RF receiver and a second RF oscillator configured to communicate with the tunable RF transmitter, the first and second RF oscillators being configured to communicate frequency information to the tunable RF transmitter and to the tunable RF receiver to determine and tune the slave frequency of the tunable RF receiver and the slave frequency of the tunable RF transmitter.

14. The wireless network according to claim 1, wherein said signal processor is further configured to compute a frequency error of said RF oscillator by comparing information from said calibration signal from said master node to a corresponding signal from said RF oscillator to calculate a communicating frequency that more closely matches said master frequency than said initial detected master frequency.

15. The wireless network according to claim 1, wherein the slave node further comprises a local clock configured to communicate with said tunable RF receiver to provide timing information to said tunable RF receiver.

16. The wireless network according to claim 15, wherein the local clock is configured to receive a calibration signal from the master node, said calibration signal containing time information or frequency information, or both, to tune the local clock to the master clock of the master node.

17. The wireless network according to claim 15, wherein the local clock comprises a low frequency oscillator having a lower frequency than the RF oscillator frequency of the RF oscillator.

18. The wireless network according to claim 1, wherein said calibration signal contains at least two beacon signals transmitted from the master node to the slave node at two distinct points in time.

19. A wireless slave node for a wireless network system, comprising:
- a tunable radiofrequency (RF) receiver configured to be in wireless communication with a master node and to receive at a slave frequency, the master node being configured to transmit at a master frequency;
- an RF oscillator configured to communicate with the tunable RF receiver, the RF oscillator being configured to communicate an RF oscillator frequency to the RF receiver to determine and tune the slave frequency;
- a signal processor configured to communicate with said tunable RF receiver;
- wherein said signal processor is further configured to provide instructions to said tunable RF receiver to search for reception of a signal from said master node by tuning said slave frequency of said tunable RF receiver within a predetermined search band of frequencies, to provide an initial detected master frequency,
- wherein said signal processor is further configured to instruct said tunable RF receiver to receive a calibration signal at said initial detected master frequency from said master node, said calibration signal containing time information or frequency information, or both, and
- wherein said signal processor is further configured to provide a frequency error of said RF oscillator frequency relative to said calibration signal by comparing information from said calibration signal to a corresponding signal from said RF oscillator to tune the RF oscillator frequency to the frequency of the master node to enable communication between said slave node and said master node at said tuned RF oscillator frequency.

* * * * *